(12) United States Patent
Sears et al.

(10) Patent No.: US 7,259,567 B2
(45) Date of Patent: Aug. 21, 2007

(54) POWER TESTER FOR ELECTRICAL OUTLETS

(75) Inventors: Harold Sears, 1010 Industrial Rd., Suite 233, Boulder City, NV (US) 89005; Wayne Slater, Henderson, NV (US)

(73) Assignee: Harold Sears, Boulder City, NV (US)

( * ) Notice: Subject to any disclaimer, the term of this patent is extended or adjusted under 35 U.S.C. 154(b) by 0 days.

(21) Appl. No.: 11/280,998

(22) Filed: Nov. 17, 2005

(65) Prior Publication Data

US 2006/0132143 A1 Jun. 22, 2006

Related U.S. Application Data

(60) Provisional application No. 60/628,621, filed on Nov. 18, 2004.

(51) Int. Cl.
G01R 31/00 (2006.01)
H01H 31/02 (2006.01)

(52) U.S. Cl. ........................................ 324/508; 324/555
(58) Field of Classification Search ................ 324/508
See application file for complete search history.

(56) References Cited

U.S. PATENT DOCUMENTS

| 4,227,145 A | 10/1980 | Bonikowski et al. |
| 4,527,118 A | 7/1985 | Koslar |
| 4,540,940 A | 9/1985 | Nolan |
| 4,814,712 A | 3/1989 | Burton et al. |
| 4,862,142 A * | 8/1989 | Knight ........................ 340/522 |
| 5,250,893 A | 10/1993 | Gambill et al. |
| 5,625,285 A * | 4/1997 | Virgilio ........................ 324/133 |
| 6,020,822 A * | 2/2000 | Marshall ..................... 340/654 |
| 6,366,208 B1 * | 4/2002 | Hopkins et al. ............. 340/650 |
| 6,629,021 B2 | 9/2003 | Cline et al. |
| 2005/0105230 A1 * | 5/2005 | Bailey .......................... 361/90 |
| 2005/0275409 A1 * | 12/2005 | Mason et al. ................ 324/508 |

OTHER PUBLICATIONS

See www.mastertech-inc.com/tripp/; RV "Instant-Read" Circuit Tester, CT120 Circuit Tester, date unknown.
See www.tigerdirect.com/; Tenma GFCI/Polarity AC Socket Tester and Tenma Pocket DMM with Bargraph, date unknown.
See www.dyersonline.com; AC Line Monitor/Polarity Tester, date unknown.
See www.campingworld.com; 3-Wire Circuit Analyzer, date unknown.
See www.timberman.com/ELECTRIC/electric.htm; Good Governor, Volt-A-Check II, and RV Electronics GFI+ Surge Suppressor; Sep. 16, 2005.

* cited by examiner

Primary Examiner—Walter Benson
Assistant Examiner—Jeff Natalini
(74) Attorney, Agent, or Firm—Bose McKinney & Evans LLP

(57) ABSTRACT

A power tester apparatus for testing an electrical outlet. The power tester apparatus includes multiple indicators for identifying the condition of the electrical outlet.

18 Claims, 8 Drawing Sheets

POWER TESTER FOR ELECTRICAL OUTLETS

CROSS-REFERENCE TO RELATED APPLICATION

This application relates to U.S. Provisional Patent Application Ser. No. 60/628,621, filed Nov. 18, 2004, titled Electrical Analysis Instrument for Testing of 50 Amp Electrical Service Connections, to Sears et al.

BACKGROUND AND SUMMARY OF THE INVENTION

The present invention relates to power tester devices, in particular a recreational vehicle power testing device used for electrical outlets.

It is known that faulty electrical outlets can produce potentially dangerous consequences if connected to an electrical conductor, such as an electrical cord or an electrical appliance. For example, an outlet may be wired incorrectly or provide too much or too little voltage or current and cause damage to those items electrically connected to the outlet. It is also known that circuit breakers may be turned off so that no power is provided to the electrical outlets. Presently, there are various devices in the field of testing electrical supplies such as voltmeters, as disclosed in U.S. Pat. Ser. No. 5,250,893. These devices are helpful in measuring the output voltage, but are limited to checking voltage and do not communicate information in easy to understand formats. Further, other devices are capable of providing analysis on an electrical outlet, but are limited to low amperage-type sockets. Most domestic-style electrical outlets in homes and businesses provide 20 amp or 30 amp current and consequently testing devices are limited to these ranges. In the case of recreational vehicles, camp grounds and recreational vehicle parking grounds provide 50 amp service. The domestic-style testing devices cannot analyze these outlets.

The present invention overcomes these problems. In one embodiment, an electrical outlet testing device is provided that can be connected to electrical outlets of various amperage. The device includes an exterior body with a front and rear surface or panel. On the rear surface or panel, there is at least one electrical contact member for receiving an electrical signal when connected to the outlet. A processor unit receives the signal and determines whether the outlet is wired correctly and producing quality electrical service. Quality electrical service means the outlet is producing the correct voltage and current. For example, a 220 volt, 50 amp electrical outlet would be transmitting 220 volts and 50 amps to the device plugged into the outlet. Depending on how the processor unit interprets the electrical signal, the condition of the outlet is displayed in a visual and audible format on the front surface or panel. Additional features and advantages of the invention will become apparent to those skilled in the art upon consideration of the following detailed description of illustrated embodiments exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

The embodiments described below and shown in the figures are merely exemplary and are not intended to limit the invention to the precise description disclosed. Instead, the embodiments were selected for description to enable one of ordinary skill in the art to practice the invention.

In accordance with the present invention, an electrical outlet tester apparatus is provided for connecting to an electrical outlet and testing for electrical problems with the outlet. In one embodiment, the apparatus may be connected to a 20 amp, 30 amp, or 50 amp socket.

Figure 1:
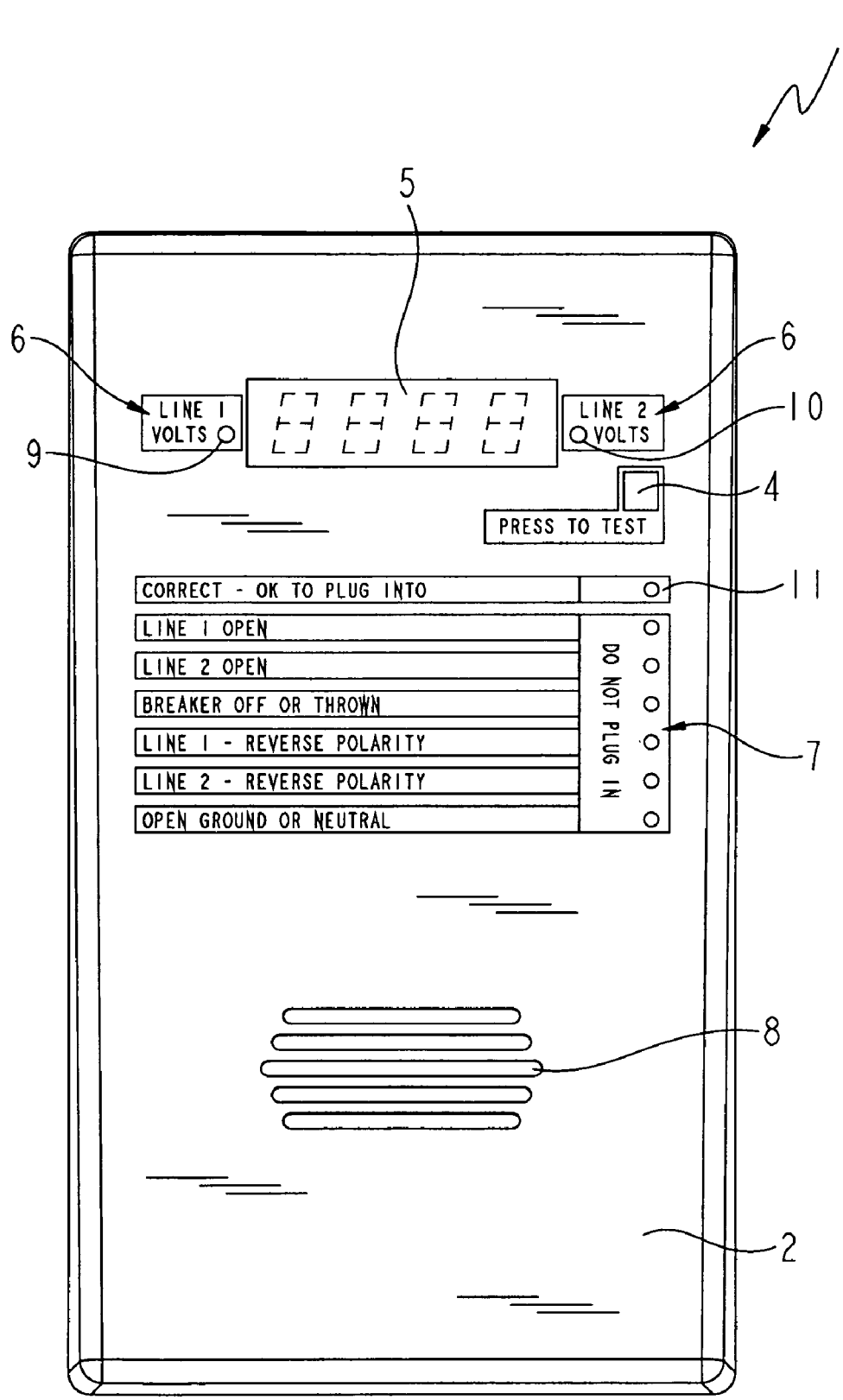
FIG. 1 is a front view of one embodiment of the electrical outlet tester apparatus with various displays shown.

As shown in FIG. 1, the electrical outlet tester apparatus 1 has a front panel 2. The front panel 2 includes a user input button 4 to activate the electrical outlet tester apparatus 1. The front panel 2 of the electrical outlet tester apparatus 1 also includes various test result displays including a four-digit light-emitting diode (LED) voltmeter display 5, two LED lamps 6 indicating which line voltage is being displayed on the voltmeter display 5, multiple LED status lamps 7 indicating the current status of the electrical outlet, and a speaker 8 for audible feedback. The two LED lamps 6 include a first line voltage lamp 9 and a second line voltage lamp 10 to indicate the line from which voltage is being measured on the voltmeter display 5. The multiple LED status lamps 7 include a satisfactory status lamp 11 indicating that the electrical outlet is wired correctly and it is safe to plug electrical devices into the outlet. The remaining lamps 7 indicate electrical problems with the outlet such as an open line, a breaker is off and no power, reverse polarity, or open ground or neutral.

Figure 2:
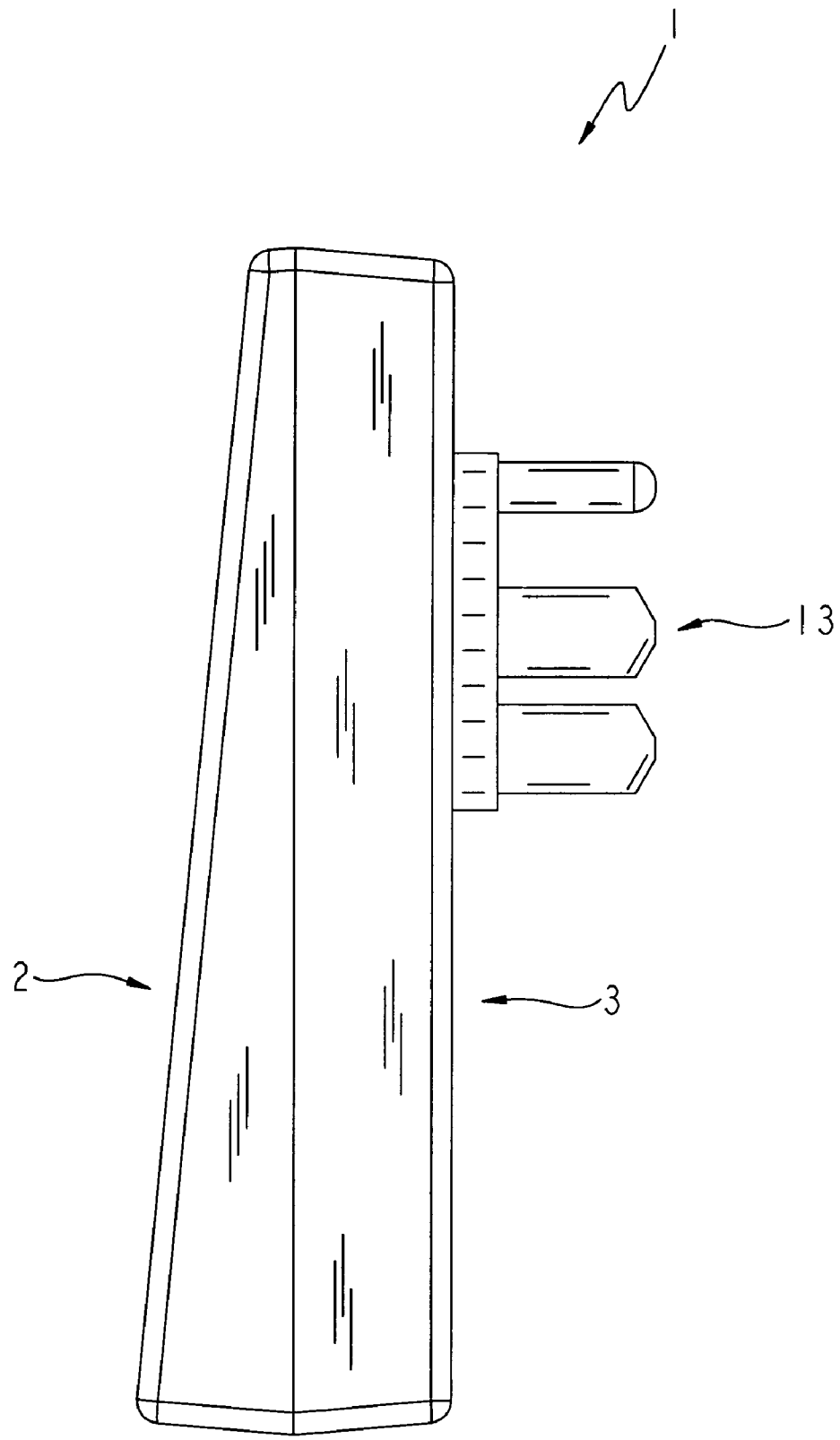
FIG. 2 is a right side view of the electrical outlet tester apparatus with the connector to the electrical outlet shown.
Figure 3:
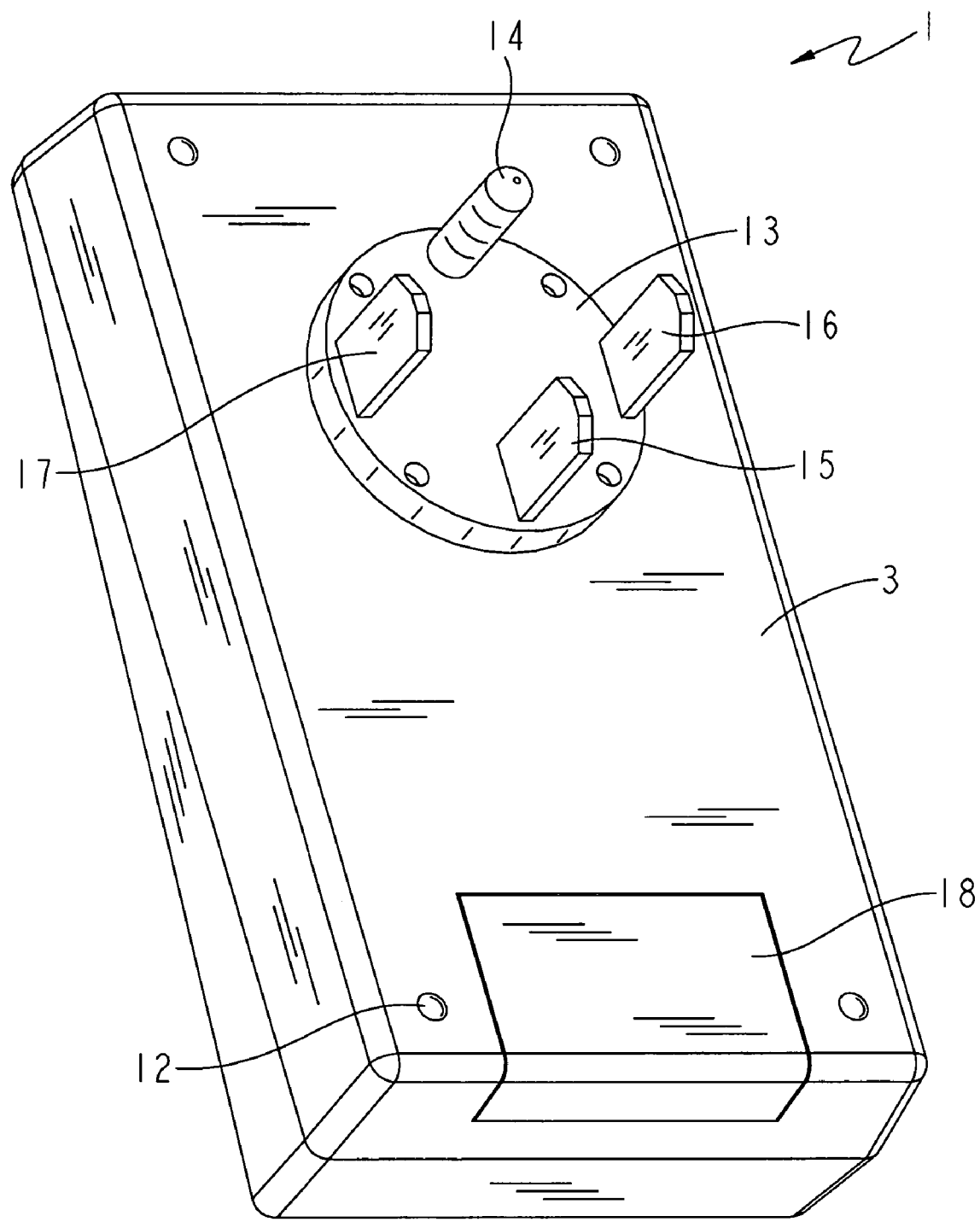
FIG. 3 is a rear perspective view of the electrical outlet tester apparatus.

As shown in FIGS. 2 and 3, the electrical outlet tester apparatus 1 includes a front panel 2 and rear panel 3. The front panel 2 and rear panel 3 are coupled together with multiple fasteners 12. The rear panel 3 includes a multiple prong conductor 13 for coupling directly to an electrical outlet. The multiple prong conductor 13 includes a ground electrical contact member 14, a neutral electrical contact member 15, a first line voltage contact member 16, and a second line voltage contact member 17. Also included in the rear panel 3 is a battery compartment 18 for holding batteries as its source of electrical power for the electrical outlet tester apparatus 1.

Figure 4:
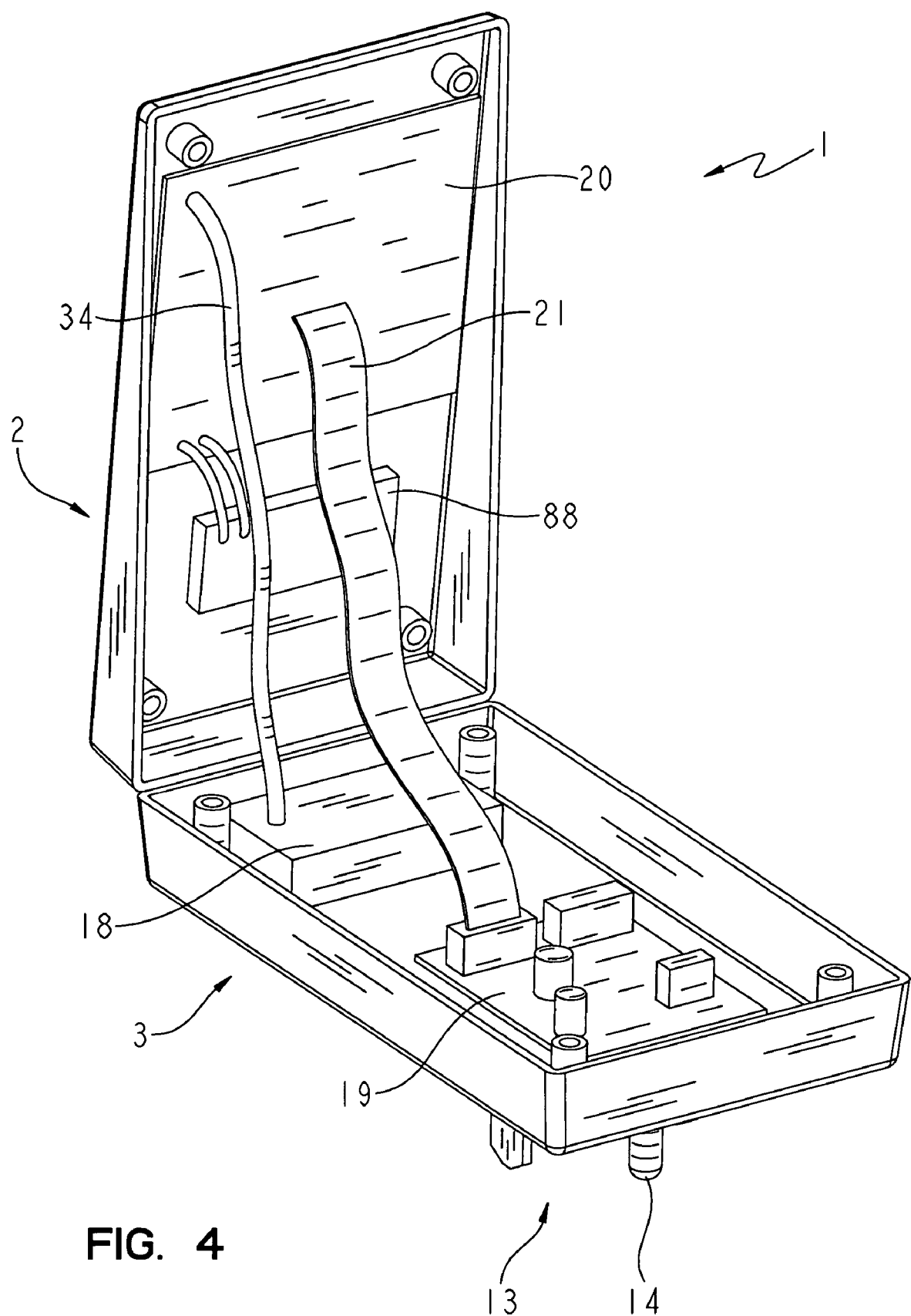
FIG. 4 is a perspective view of the electrical outlet tester apparatus with the front panel removed to show the interior circuit boards connected together by a multi-conductor cable assembly.

As shown in FIGS. 3 and 4, the electrical outlet tester apparatus 1 includes an AC Entry printed circuit board assembly (PCBA) 19 and a Processor PCBA 20. The AC Entry PCBA 19 is coupled to the rear panel 3. The multiple prong conductor 13 is electrically connected to the AC Entry PCBA 19. The Processor PCBA 20 is coupled to the front panel 2. A cable assembly 21 electrically connects the AC Entry PCBA 19 to the Processor PCBA 20. A battery compartment 18 is connected to the rear panel 3. Electrical wires 34 couple the battery in the battery compartment 18 to the Processor PCBA 20. The rear panel 3 includes a voice playback device 88 which is connected to the Processor PCBA 20.

Figure 5:
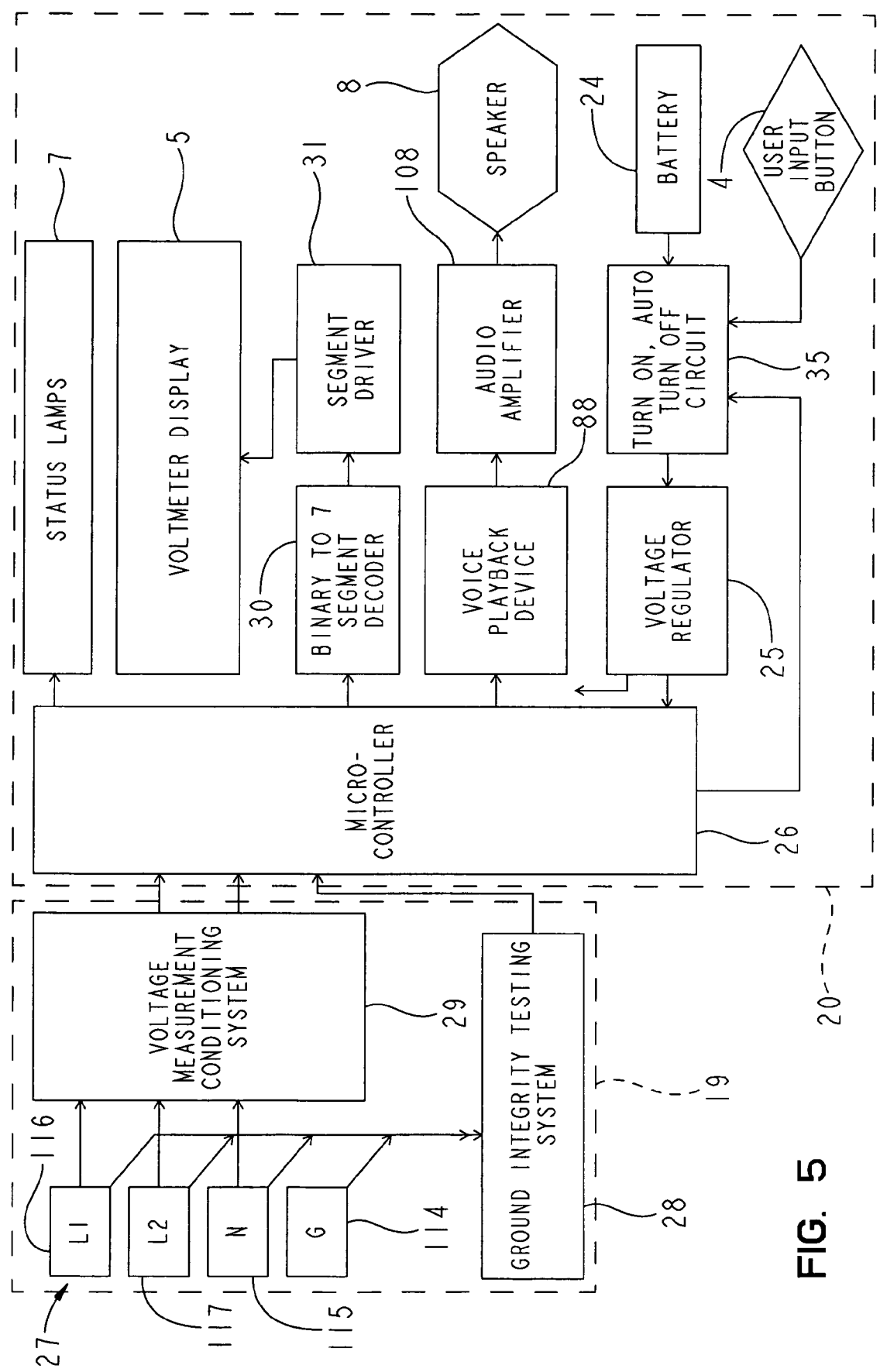
FIG. 5 is a block diagram of the circuitry of the electrical outlet tester apparatus.

FIG. 5 is a block diagram of one embodiment of the circuitry for the electrical outlet tester apparatus 1. As illustrated in FIG. 5, the apparatus 1 is activated by a user input button 4. The user input button 4 is coupled to a turn on, auto turn off circuit 35. In one embodiment, a battery 24 may provide power to the turn on, auto turn off circuit 35. The voltage provided by the battery 24 is regulated by a voltage regulator 25 prior to being received by a microcontroller 26.

The electrical signals 27 produced by the electrical outlet are indicated as a first line voltage, "L1" 116, a second line voltage, "L2" 117, a ground voltage, "G" 114, and a neutral voltage, "N" 115. These voltages are received by a ground integrity testing system 28. The ground integrity testing system 28 determines whether there is an open ground or neutral in the electrical wiring of the electrical outlet. The results from the ground integrity testing system 28 are transmitted to the microcontroller 26 and stored. In addition, the first line voltage 116, the second line voltage 117, and neutral voltage 115 are transmitted through a voltage measurement conditioning system 29. In the voltage measurement conditioning system 29, the first line voltage 116 and the second line voltage 117 signals are sampled over a time duration and the final result is transmitted and stored in the microcontroller 26. In one embodiment, the time duration is 17 milliseconds, the period of an entire 60 hertz sine wave.

The microcontroller 26 includes a software program that is used to evaluate the stored results. One type of a microcontroller that may be used is part number PIC16F871 from Microchip Technology Incorporated. Once the results stored in the microcontroller 26 are evaluated, corresponding test results are determined. The microcontroller 26 transmits the test results through a binary to 7 segment decoder 30 and segment driver 31. One type of segment decoder and driver that may be used is part number CD74HC4511 from Texas Instruments Incorporated. From the segment driver 31, the voltmeter display 5 indicates the voltage sampled for each of the first line voltage 116 and second line voltage 117. One type of a voltmeter display that may be used is part number MSQC6110C from Fairchild Semiconductor Corporation. Concurrently, the evaluated results stored in the microcontroller 26 are transmitted to the multiple LED status lamps 7. The status lamps 7 provide a descriptive indication of the condition of the electrical outlet. Also simultaneously, the evaluated results stored in the microcontroller 26 are transmitted to the voice playback device 88. The voice playback device 88 contains pre-recorded audible messages corresponding to the transmitted evaluated results. One type of a voice playback device 88 that may be used is part number ISD2560 from Winbond Electronics Corporation. The voice playback device 88 transmits an audible message through an audio amplifier 108 to a speaker 8. The speaker 8 audibly transmits the condition of the electrical outlet.

Once the test cycle is complete, the microcontroller 26 transmits a signal to the turn on, auto turn off circuit 35 to deactivate. The apparatus enters shut down mode.

Figure 6:
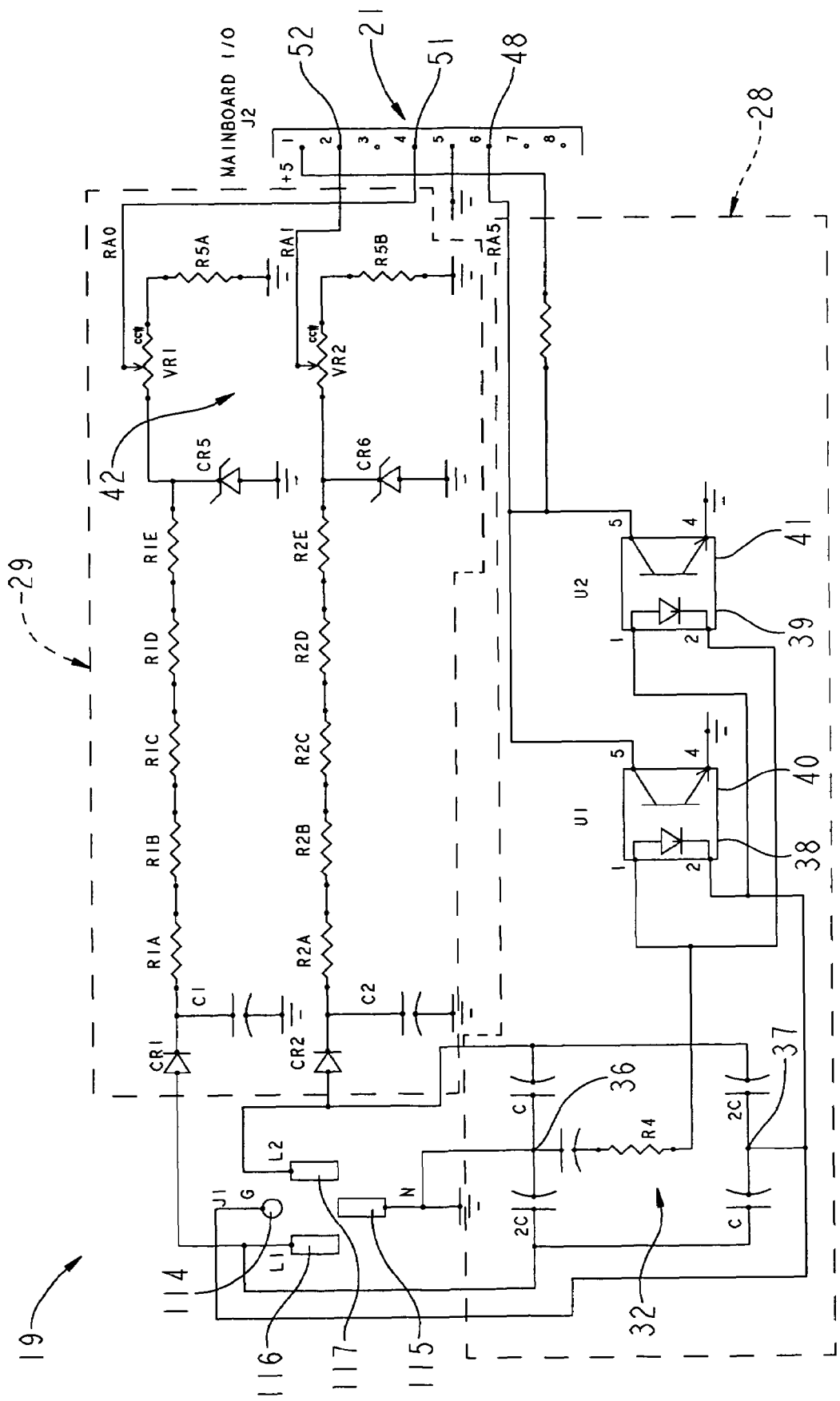
FIG. 6 is a circuit diagram of the AC Entry printed circuit board assembly.
Figure 7:
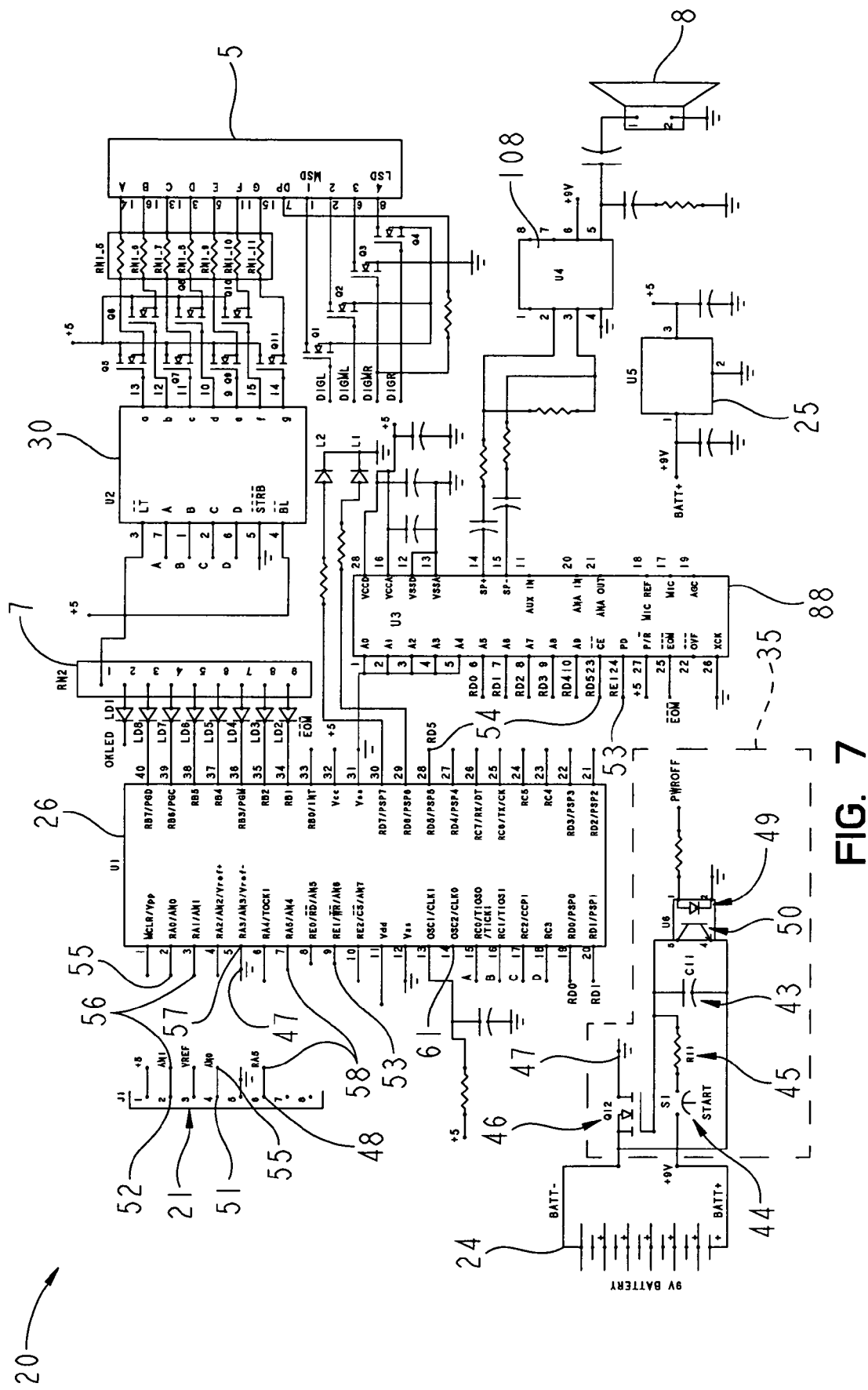
FIG. 7 is a circuit diagram of the Processor printed circuit board assembly.

FIGS. 6 and 7 provide a more detailed description of the electrical outlet tester circuitry and operation. FIG. 6 is a detailed illustration of the AC Entry PCBA 19. As illustrated in FIG. 4, the multiple prong conductor 13 is coupled to the AC Entry PCBA 19. The electrical voltages transmitted from the electrical outlet to the multiple prong conductor 13 in FIG. 4 are illustrated in FIG. 6 on the AC Entry PCBA 19 as a first line voltage 116, a second line voltage 117, a ground voltage 114, and a neutral voltage 115. Once the apparatus has been activated, the first line voltage 116, second line voltage 117, ground voltage 114, and neutral voltage 115 are evaluated for electrical problems between the ground and neutral terminals of the electrical outlet. The first circuit of the AC Entry PCBA 19 is the ground integrity testing system 28, which was also shown in FIG. 5. The voltages are transmitted into an electrical circuit of capacitors arranged in an unbalanced bridge configuration 32. Capacitors labeled as "2C" are approximately twice the capacitance of the capacitors labeled as "C" in the unbalanced bridge configuration 32. The values of the capacitors are selected such that only a minimal current may flow through each capacitor. The first line voltage 116, second line voltage 117, and neutral voltage 115 are summed together at a first node 36. In addition, the first line voltage 116, second line voltage 117, and ground voltage 114 are summed at a second node 37. These summed voltages pass through to a first optoisolator 38 and a second optoisolator 39.

In a properly wired electrical outlet, the summed voltages at the entrances of the first optoisolator 38 and second optoisolator 39 do not create a significant voltage difference between the anode and cathodes of the first optoisolator 38 and second optoisolator 39. Therefore, the LED internal to the first optoisolator 38 and the LED internal to the second optoisolator 39 are not illuminated and the optically coupled first phototransistor 40 and second phototransistor 41 remain open. In the embodiment described, if an electrical signal is applied to the input of the optoisolator 38 or 39, the optoisolator's internal LED illuminates, an internal light sensor activates, and a corresponding electrical signal is generated at the output. The current entering the input of the optoisolator 38 or 39 is converted into an optical state and a corresponding electrical state is transmitted from the optoisolator based on the amount of current that entered. In the instance where the LED's are not illuminated, a high logic state indicates that the ground to neutral relationship is acceptable and such information is transmitted to the Processor PCBA 20 through the multi-conductor cable assembly 21 at 48.

When the ground conductor within the electrical outlet is open, there exists a difference in potential at the inlet of the first optoisolator 38 and second optoisolator 39. This voltage difference between the anode and cathode causes the LED internal to the second optoisolator 39 to illuminate and closes the second phototransistor 41. Consequently, a low logic state is indicated due to a ground fault and the low logic state is transmitted to the Processor PCBA 20 through the multi-conductor cable assembly 21 at 48.

When the neutral conductor within the electrical outlet is open, there exists a difference in potential at the inlet of the first optoisolator 38 and second optoisolator 39. This voltage difference between the anode and cathode causes the LED internal to the first optoisolator 38 to illuminate and closes the first phototransistor 40. A low logic state is indicated and transmitted to the Processor PCBA 20 through the multi-conductor cable assembly 21 at 48.

A second circuit 29 within the AC Entry PCBA 19 is also illustrated in FIG. 6. This circuit is shown in FIG. 5 as the voltage measurement conditioning system 29. In this circuit, the first line voltage 116 and second line voltage 117 are rectified and sampled. A restrictive voltage divider 42 reduces both line voltages prior to being transmitted to the multi-conductor cable assembly 21. The output first line voltage 51 and output second line voltage 52 are transmitted by the multi-conductor cable assembly 21 to the Processor PCBA 20.

FIG. 7 is a detailed illustration of the Processor PCBA 20. In FIG. 7, when the start switch (S1) 44 (labeled as 4 in FIGS. 1 and 5) is activated, a current flows from the battery 24 positive terminal and charges capacitor (C11) 43 through the current-limiting resistor (R11) 45 in the Turn On Auto Turn Off Circuit 35. Once a charge on capacitor (C11) 43 has attained a voltage in excess of 2.5 volts, the gate of the metal-oxide-semiconductor field effect transistor (MOSFET) 46 enables full conduction of the device through the drain to source path. The illustrative embodiment includes a MOSFET (Q12) 46, but other suitable components could be used. In one embodiment, due to the ultra high impedance of the MOSFET (Q12) 46, the capacitor (C11) 43 will retain a charge for a period duration in excess of the time required for the apparatus to complete the current work cycle. The current work cycle is the time lapse from the activation of the apparatus 1 to deactivation. This work cycle varies between approximately twenty and twenty-five seconds, depending on the condition of the electrical outlet. The negative lead of the battery 24 couples to the common ground 47 of the processor PCBA 20. Current flows to the +5V regulator 25, and once the voltage stabilizes, all active devices enter a power up or standby mode depending on each device function.

In a second embodiment, the capacitor (C11) 43 will retain a charge for a period sufficient for the microcontroller to activate. Once activated, a clock signal 61 is produced by the microcontroller and is applied to the gate of the MOSFET (Q12) 46 through the voltage regulator 25. This keeps the MOSFET (Q12) 46 in full conduction until the current work cycle is completed. The negative lead of the battery 24 couples to the common ground 47 of the processor PCBA 20. Current flows to the +5V regulator 25, and once the voltage stabilizes, all active devices enter a power up or standby mode depending on each device function.

Figure 8:
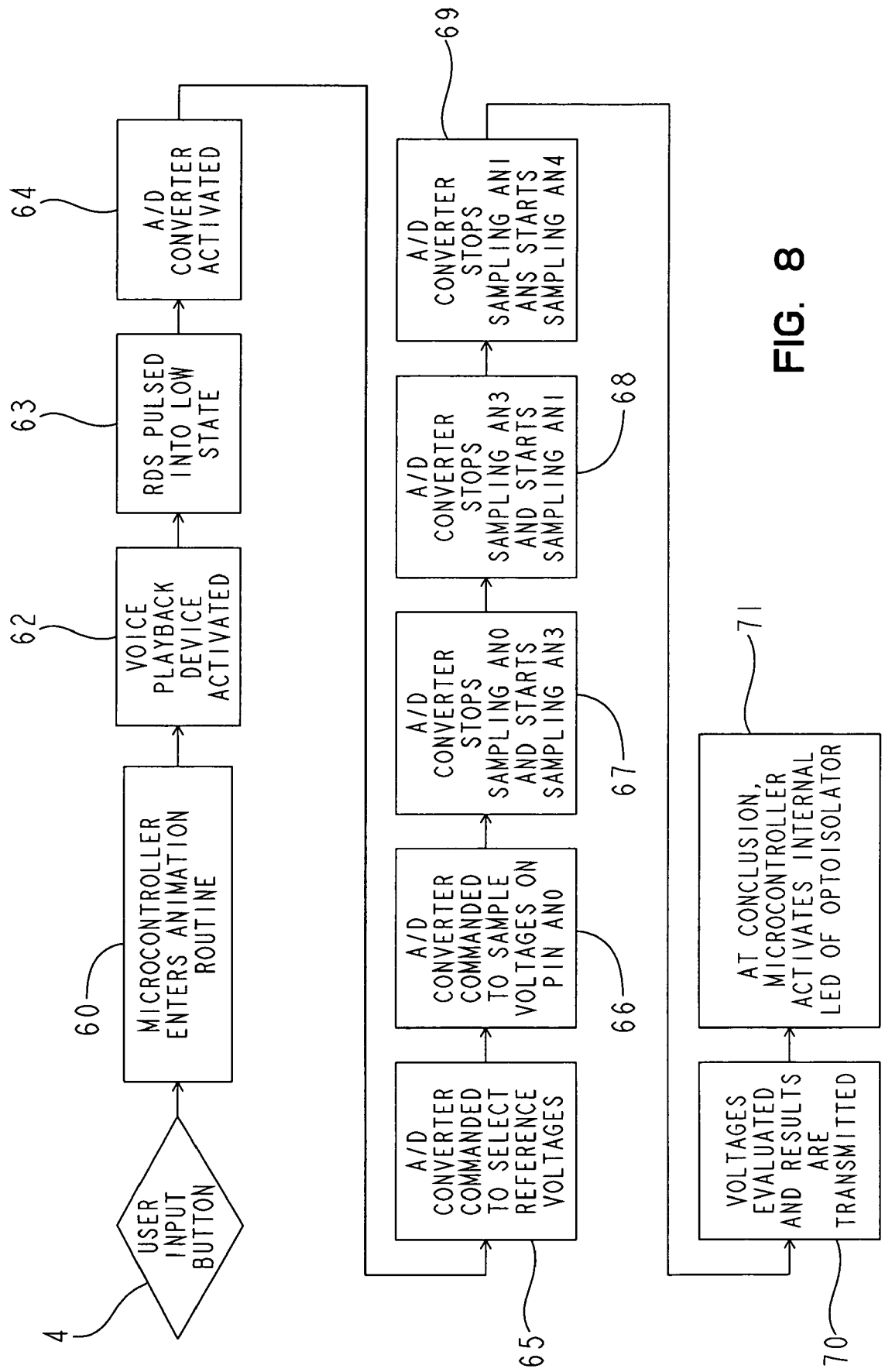
FIG. 8 is a flow chart of the software program carried out within the microcontroller.

Once the microcontroller 26 enters a power up state, the microcontroller 26 begins to execute a software program installed within the memory storage. FIG. 8 is a flow chart of the procedural steps commanded by the software program internal to the microcontroller. The program begins operation once the user input button 4 is pressed. Referring to FIG. 8, initially the program directs the microcontroller 26 to begin an animation routine 60. During the animation routine 60, the voltmeter display 5 powers off and the two LED lamps 6 illuminate alternatively in a rapid fashion. After stabilizing, the microcontroller 26 I/O pin (RE1) 53 is brought to a low state. This action powers up the voice playback device 88 (Step 62), awakening the voice chip from standby mode. Microcontroller 26 I/O pin (RD5) 54 is momentarily pulsed to a low state at step 63, initiating playback from the voice playback device 88 of the addressed audio message. This produces an introductory audible message.

As the activation process proceeds the software program activates the analog to digital (A/D) converter at step 64 built into the microcontroller 26, directs the selection of a reference voltage at step 65 to be used by the A/D converter, and samples the voltage at step 66 present on (AN0) pin 55 of the microcontroller 26. (AN0) pin 55 is the I/O pin used for measurement of the output first line voltage 51. As illustrated in FIGS. 6 and 7, the output first line voltage 51 is transmitted from the AC Entry PCBA 19 through the multi-conductor cable assembly 21 to (AN0) pin 55 of the microcontroller 26. Through successive approximation, the analog voltage value of the output first line voltage 51 is reduced to a 10-bit binary word. This sampling cycle is repeated at maximum speed for 17 ms, the period of an entire 60 hz sine wave. During the sampling, the highest recorded 10-bit binary word for the output first line voltage 51 is stored in a register location in random access memory (RAM) of the microcontroller 26 specifically designated to store (AN0) pin 55 sample.

As shown in FIGS. 7 and 8, the A/D converter is commanded at step 67 to stop sampling the (AN0) pin 55 and connect to (AN3) pin 57. The (AN3) pin 57 is connected to common ground 47. This action discharges a sampling capacitor internal to the microcontroller 26 and prevents inaccurate readings from occurring when the output first line voltage 51 and output second line voltage 52 are at widely disparate voltages. Once the A/D converter is commanded to stop sampling (AN3) pin 57, (AN1) pin 56 is sampled at step 68. (AN1) Pin 56 is used for the measurement of the output second line voltage 52. A similar sampling process is completed by the microcontroller 26 and the highest recorded 10-bit binary word of the output second line voltage 52 is stored in a RAM register designated for the output second line voltage 52 sample. Following the sampling of the output first line voltage 51 and output second line voltage 52, the microcontroller 26 tests the logic state at step 69 of the ground/neutral status of (AN4) pin 58 of the microcontroller 26. As shown in FIG. 6, this logic state is determined by the unbalanced bridge configuration 32 of capacitors on the AC Entry PCBA 19. The logic state is transmitted from the AC Entry PCBA 19 to the multi-conductor cable assembly 21 at 48. As shown in FIG. 57, the logic state is transmitted by the multi-conductor cable assembly 21 (from 48) to (AN4) pin 58 on the microcontroller 26. The microcontroller 26 samples (AN4) pin 58 in a similar manner as the output first line voltage 51 and output second line voltage 52.

If one sample on (AN4) pin 58 returns a low state, the ground/neutral test fails. The final ground/neutral test result is stored in a dedicated RAM register in the microcontroller 26. As shown in FIG. 8, the microcontroller 26 is commanded to evaluate the results stored 70 and convert the voltages into numeric form on the voltmeter display 5. As shown in FIG. 5, the binary values of the respective line voltages are transmitted at steps 70 through the binary to 7 segment decoder 30 and segment driver 31 before the numerical voltages are displayed in digital form on the voltmeter display 5. Simultaneously, the software program commands the microcontroller 26 to convert the stored sampled values of the output first line voltage 51 and output second line voltage 52 into flags and places the flags into predetermined voltage ranges. The microcontroller 26 evaluates the placement of the flags within the voltage ranges. An example of one embodiment of these voltage ranges and the corresponding test results are shown in the table below. The term "Vthr" refers to a predetermined threshold voltage.

| First Line Voltage Flag | Second Line Voltage Flag | Ground/Neutral Voltage Flag | Final Test Result of Electrical Outlet |
|---|---|---|---|
| >108, <132 VAC | >108, <132 VAC | <8 VAC | Outlet is wired correctly |
| 0-Vthr AC | >108, <132 VAC | <8 VAC | First Line Voltage Open |
| >108, <132 VAC | 0-Vthr AC | <8 VAC | Second Line Voltage Open |
| 0-Vthr AC | 0-Vthr AC | <8 VAC | No Power Detected |

-continued

| First Line<br>Voltage Flag | Second Line<br>Voltage Flag | Ground/Neutral<br>Voltage Flag | Final Test Result of<br>Electrical Outlet |
|---|---|---|---|
| >Vthr AC,<br><108 VAC | Any Voltage | <8 VAC | Voltage Not Acceptable |
| Any Voltage | >Vthr AC,<br><108 VAC | <8 VAC | Voltage Not Acceptable |
| >108, <132 VAC | >132 VAC | <8 VAC | Reverse Polarity First Line Voltage |
| >132 VAC | >108, <132 VAC | <8 VAC | Reverse Polarity Second Line Voltage |
| >132 VAC | >132 VAC | <8 VAC | Voltage Not Acceptable |
| Any Voltage | Any Voltage | >8 VAC | Faulty Ground or Neutral Detected |

At the conclusion of the introductory audible message, an active low pulse signal is generated by the voice playback device 88. The pulse signal causes the microcontroller 26 to respond to the data collected. The sampled voltages of the output first line voltage 51 and output second line voltage 52 are alternatively displayed on the four-digit LED voltmeter display 5 as shown in FIG. 1. One of the two LED lamps 6 adjacent to the four-digit LED voltmeter display 5 in FIG. 1 will illuminate to indicate which corresponding voltage is being displayed. For example, if the voltmeter display shows the output first line voltage 51 to be 110 volts, the first line voltage lamp 9 will illuminate. Simultaneously, the appropriate lamp of the multiple LED status lamps 7 is illuminated. Concurrent with the visual displays, an audible message is played through the speaker 8 shown in FIG. 1.

At the completion of the test cycle, the apparatus enters shut-down mode. At the conclusion of the audible message, an "end of message" pulse generated by the voice playback device 88 indicates to the microcontroller 26 that it must enter shutdown mode. Shutdown mode causes playback of an audio message that warns of impending shutdown. In one embodiment, as shown in FIG. 8, on the occurrence of the next "end-of-message" pulse generated by the voice playback device 88, the software program directs the microcontroller 26 to activate 71 the LED internal to the power down optoisolator 49. This action causes the power down phototransistor 50 to conduct, discharges capacitor (C11) 43, removes the gate to MOSFET (Q12) 46 and deactivates the apparatus.

In a second embodiment, on the occurrence of the next "end-of-message" pulse generated by the voice playback device 88, the software program directs the microcontroller 26 to deactivate and shutdown. As the microcontroller 26 enters shutdown mode, the clock signal 61 is unapplied to the gate to MOSFET (Q12) 46 and deactivates the apparatus.

Although the invention has been described in detail with reference to one preferred embodiment, variations and modifications exist within the scope and spirit of the present invention.

What is claimed is:

1. An electrical power tester for evaluating the condition of an electrical outlet comprising:

a user-input member for activating the tester;

an activation circuit operably coupled to the user-input member;

an electrical measurement system for receiving and transmitting information from the electrical outlet;

a microcontroller operably coupled to the activation circuit, wherein the microcontroller receives information from the electrical measurement system, interprets the information, and transmits corresponding results based on the information; and a plurality of indicators operably coupled to the microcontroller providing test results of the electrical outlet audibly and visually, wherein the ground integrity testing system comprises:

a plurality of capacitors configured in an unbalanced bridge configuration;

a plurality of optoisolators receiving electrical signals from the capacitors; and a plurality of phototransistors electrically coupled to the microcontroller for transmitting logic status values.

2. The electrical power tester of claim 1, further comprising:

a body having a front and a rear panel;

a multiple prong conductor extending from the rear panel for receiving a signal when coupled to the electrical outlet, the multiple prong conductor having a ground electrical contact member, a neutral electrical contact member, a first line voltage contact member and a second line voltage contact member;

a processor unit for receiving the signal and determining a state of the signal;

a display system for usually indicating the state of the signal; and an audible system for audibly indicating the state of the signal.

3. The electrical power tester of claim 2, wherein the display system comprises:

a first display for displaying the state of the signal from the multiple prong conductor;

a second display for indicating that no signal is received from the multiple prong conductor.

4. The electrical power tester of claim 2, wherein the multiple prong conductor is operable with any one of a 20 amp, 30 amp, and 50 amp electrical outlet.

5. The electrical power tester of claim 1, further comprising:

a multiple prong conductor for operably coupling to the electrical outlet and transmitting information from the electrical outlet, the multiple prong conductor having a ground electrical contact member, a neutral electrical contact member, a first line voltage contact member and a second line voltage contact member;

an evaluation circuit for receiving the transmitted information from the multiple prong conductor and generating at least one output representing a state of electrical outlet;

a signal conditioning circuit operably coupled to the evaluation circuit receiving analog information from the electrical outlet and converting it to a digital signal;

a visual display electrically coupled to the output of the evaluation circuit, wherein the visual display displays a visual indication of the integrity of the electrical outlet; and an audio system electrically coupled to the output of the evaluation circuit, wherein the audio system produces an audible indication of the integrity of the electrical outlet.

6. The electrical power tester of claim 5, wherein the visual display comprises:

a voltmeter display providing numeric voltage information for at least one line voltage;

a first display including a plurality of light-emitting diode status lamps, wherein the lamps identify which line voltage is simultaneously being displayed on the voltmeter display; and, a second display including a plurality of light-emitting diode status lamps identifying the condition of the electrical outlet.

7. The electrical power tester of claim 5, wherein the audio system comprises:

at least one speaker; and a voice playback circuit, wherein the voice playback circuit is operably coupled to the speaker for transmitting a pre-recorded voice information.

8. The electrical power tester of claim 5, wherein the multiple prong conductor is operable with any one of a 20 amp, 30 amp, and 50 amp electrical outlet.

9. The electrical power tester of claim 1, wherein the activation circuit comprises:

a power supply;

a start switch operably coupled to the power supply;

a charging capacitor;

a current-limiting resistor; and, a metal-oxide-semiconductor field effect transistor, wherein the metal-oxide-semiconductor field effect transistor is electrically coupled to the start switch, charging capacitor, and current-limiting resistor.

10. The electrical power tester of claim 1, wherein the electrical measurement system receives and transmits information from any one of a 20 amp, 30 amp, and 50 amp electrical outlet.

11. The electrical power tester of claim 1, wherein the microcontroller includes an analog to digital converter.

12. The electrical power tester of claim 11, wherein the microcontroller comprises:

a plurality of random access memory registers for data storage; and a software program for coordinating the test procedure.

13. The electrical power tester of claim 1, wherein the plurality of indicators includes at least one of a numeric display system, an electrical condition display system, and an audio display system.

14. The electrical power tester of claim 13, wherein the numeric display system comprises:

a decoder and driver for converting electrical information into digital format; and, a digital light-emitting diode voltmeter display.

15. The electrical power tester of claim 13, wherein the electrical condition display system comprises a plurality of light-emitting diode status lamps providing visual condition descriptions analysis.

16. The electrical power tester apparatus of claim 13, wherein the audio display system includes a voice playback device which stores pre-recorded voice messages.

17. The electrical power tester of claim 13, wherein the audio display system includes an audio amplifier.

18. The electrical power tester of claim 13, wherein the audio display system includes at least one speaker.

* * * * *